United States Patent [19]
Ma

[11] Patent Number: 6,067,252
[45] Date of Patent: May 23, 2000

[54] ELECTRICALLY ERASABLE NON-VOLATILE MEMORY CELL WITH NO STATIC POWER DISSIPATION

[75] Inventor: Benny Ma, Saratoga, Calif.

[73] Assignee: Lattice Semiconductor Corporation, Hillsboro, Oreg.

[21] Appl. No.: 09/320,392

[22] Filed: May 26, 1999

[51] Int. Cl.[7] .................................................. G11C 16/04
[52] U.S. Cl. ........................ 365/185.18; 365/189.11; 365/185.23
[58] Field of Search ..................... 365/185.18, 185.23, 365/185.25, 189.11

[56] References Cited

U.S. PATENT DOCUMENTS

| | | | |
|---|---|---|---|
| 5,067,111 | 11/1991 | Asano et al. | 365/189.08 |
| 5,717,634 | 2/1998 | Smayling et al. | 365/185.23 |
| 5,815,444 | 9/1998 | Ohta | 365/189.05 |
| 5,835,402 | 10/1998 | Rao et al. | 365/149 |
| 5,862,099 | 1/1999 | Gannage et al. | 365/185.23 |
| 5,995,423 | 11/1999 | Lakhani et al. | 365/200 |

*Primary Examiner*—David Nelms
*Assistant Examiner*—Anh Phung
*Attorney, Agent, or Firm*—Skjerven, Morrill, MacPherson, Franklin & Friel LLP; Edward C. Kwok

[57] ABSTRACT

An electrically erasable non-volatile memory cell dissipates virtually no power by disabling a pull-up current when the non-volatile memory cell is programmed. In one embodiment, to properly initialize the electrically erasable non-volatile memory cell, the power of an inverting output buffer is provided only after the pull-up circuit substantially completes pulling up an input terminal of the inverting output buffer. In one embodiment, the electrically erasable non-volatile memory cell is used in a programmable integrated circuit.

3 Claims, 4 Drawing Sheets

ELECTRICALLY ERASABLE NON-VOLATILE MEMORY CELL WITH NO STATIC POWER DISSIPATION

BACKGROUND OF THE INVENTION

1. Field of the Invention

The present invention relates to electrically erasable ("E$^2$") non-volatile memory cells. In particular, the present invention relates to the design and testing of E$^2$ non-volatile memory cells in a programmable integrated circuit.

2. Discussion of the Related Art

FIG. 1 is a schematic circuit of a typical E$^2$ cell 100 used as a non-volatile configuration fuse. Such a configuration fuse, for example, can be used to configure a programmable logic circuit ("PLD"). As shown in FIG. 1, E$^2$ cell 100 includes a storage transistor device 101 with a floating gate electrode which is also the gate electrode of sense transistor 102. Storage transistor device 101 is programmed or erased during "programming mode", and read during "user mode". During programming mode, to erase storage transistor device 100, storage transistor device 101 is selected by raising the voltage at the gate terminal 108 of NMOS transistor 115 to a voltage approximately equal to ($V_{CC}$−$V_{TN}$), where $V_{CC}$ and $V_{TN}$ are the supply voltage and the threshold voltage of an NMOS transistor, respectively. At the same time, terminal 107 (a bit line) is grounded and terminal 110 is raised to a high programming voltage ($V_{pp}$) to place negative charges onto the floating gate. Conversely, to program storage transistor device 101, storage transistor device 101 is selected by raising the voltage at the gate terminal 108 of NMOS transistor 115 to a voltage approximately equal to ($V_{pp}$+$V_{TN}$). At the same time, terminal 107 (bit line) is raised to a high programming voltage, and terminal 110 is grounded to drain negative charges from the floating gate. The programming and erase times of E$^2$ cell 100 can each be as much as 20 milliseconds.

During programming mode, to verify the content of storage transistor device 101, storage transistor device 101 is selected by providing, respectively, a voltage ground at terminal 108 and a logic high voltage at terminal 109. Terminal 109 is coupled to the gate terminal of NMOS transistor 103. Gate terminal 114 of NMOS transistor 111 is also provided a voltage of $V_{CC}$. During verify, the bit line (i.e., terminal 107) is pulled up to a logic high voltage by a small current reference and sensed. If storage transistor device 101 is programmed, NMOS transistor 102 is conducting (i.e., the voltage at the gate terminal of NMOS transistor 102 is positive), thus pulling the voltage at terminal 116 to ground. Inverter 105 thus provides a logic high voltage at output terminal 106. Since terminal 106 is at a logic high voltage, conducting transistors 111 and 112 pull terminal 107 down. Conversely, if storage transistor device 101 is erased, transistor 102 is not conducting. Transistor 104, which receives the bias voltage "Biasp" at gate terminal 113, pulls terminal 116 to a logic high voltage. Consequently, inverter 105 provides a logic low voltage at terminal 106. Thus, the voltage at terminal 107 is not pulled down.

To read the content of storage transistor device 101, storage transistor device 101 is selected by providing a logic high voltage at terminal 109, which is coupled to the gate terminal of NMOS transistor 103. Drain terminal 116 of transistor 103 is coupled to the drain terminal of PMOS transistor 104, which receives a bias voltage "Biasp" at its gate terminal 113. If storage transistor device 101 is programmed, NMOS transistor 102 is conducting (i.e., the voltage at the gate terminal of NMOS transistor 102 is positive), thus pulling the voltage at terminal 116 to ground. Inverter 105 thus provides a logic high voltage at output terminal 106, indicating that storage transistor device 101 is programmed. Conversely, if storage transistor device 101 is erased, transistor 102 is not conducting. Transistor 104, which receives the bias voltage Biasp at gate terminal 113, pulls terminal 116 to a logic high voltage. Consequently, inverter 105 provides a logic low voltage at terminal 106 to indicate that storage transistor device 101 is erased.

One drawback of E$^2$ cell 100 is, when storage transistor cell 101 is programmed, a current which is drawn through PMOS transistor 104 and NMOS transistors 102 and 103 during a read operation. Although this current is limited to a few microamps by the bias voltage at terminal 113, the current can be significant when a large number of E$^2$ cells exist in a programmable integrated circuit.

Another drawback of E$^2$ cell 100 relates to the long programming and erasing times. To perform a function test of a circuit implemented in the programmable integrated circuit, it is often necessary to change the programmed or erased states of multiple E$^2$ cells multiple times. For example, in a demultiplexer circuit which demultiplexes a data bus to twenty data destinations, the E$^2$ cells that configure the demultiplexer will each have to be programmed or erased more than twenty times. The time required for such a functional test can become prohibitively long.

SUMMARY OF THE INVENTION

The present invention provides an electrically erasable non-volatile memory cell which consumes virtually no power. In one embodiment, the electrically erasable non-volatile memory cell includes (a) a bit line; (b) a word line; (c) a storage cell including a floating gate transistor for storing a logic value; (d) an input transistor, controlled by a first control signal on the word line, for writing into the storage cell, as the logic value, a logic voltage on the bit line; (e) a pass transistor, controlled by a second control signal and coupled to the storage cell, for providing the logic value on a first terminal; (f) an inverting output buffer coupled to the first terminal for providing as an output logic value the logical complement of the logic value; and (g) a pull-up circuit coupled to the first terminal to urge a voltage on the first terminal towards a supply voltage, the pull-up circuit being controlled by the output logic value. In one embodiment, the pull-up circuit is disabled when the storage cell holds a logic high ("programmed") value.

In one embodiment, the pull-up circuit of the electrically erasable non-volatile memory cell includes: (a) a first transistor having a drain terminal, a gate terminal and a source terminal, the source terminal of the first transistor being coupled to a supply voltage, the gate terminal of the first transistor receiving a bias voltage; and (b) a second transistor having a drain terminal, a gate terminal and a source terminal, the source terminal of the second transistor being coupled to the drain terminal of the first transistor, the gate terminal of the second transistor being coupled to receive the output logic value, and the drain terminal of the second transistor being coupled to the first terminal.

In one embodiment, the electrically erasable non-volatile memory cell is initialized by a control circuit which provides power to the inverting output buffer subsequent to the pull-up circuit urging the voltage on the first terminal to substantially a supply voltage.

A pull-up circuit in the electrically erasable non-volatile memory cell provided according to the present invention dissipates substantially no static power due to the absence of a static current, regardless of whether the storage cell is programmed or erase. Consequently, at high density, the electrically erasable non-volatile memory cell provides significant power advantage over prior art cells.

The present invention is better understood upon consideration of the detailed description below and the accompanying drawings.

BRIEF DESCRIPTION OF THE DRAWINGS

To facilitate cross-referencing between the figures, like elements are provided like reference numerals.

DETAILED DESCRIPTION OF THE PREFERRED EMBODIMENTS

Figure 1:
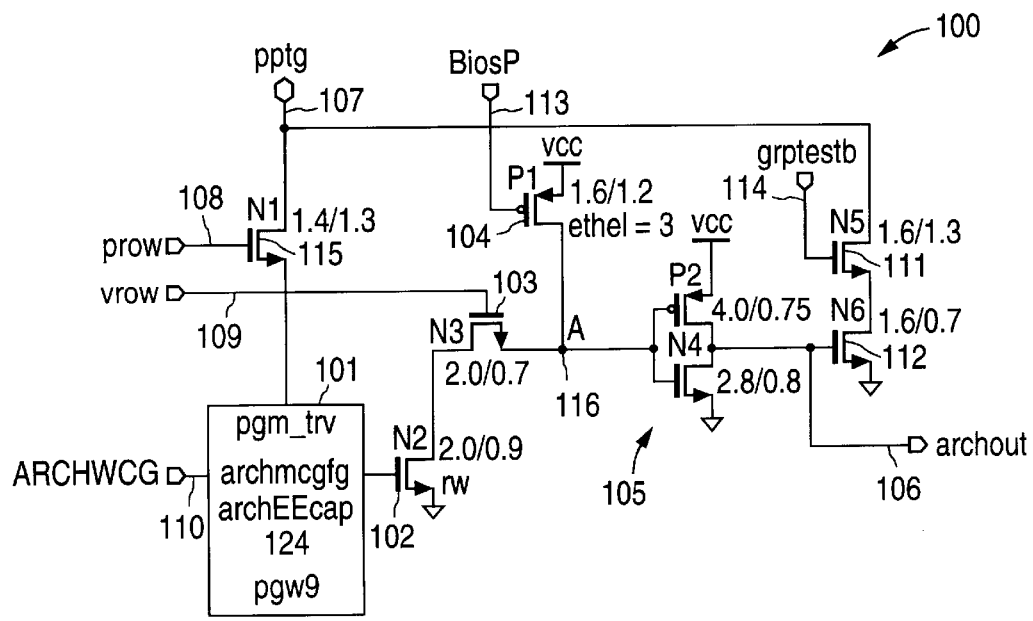
FIG. 1 is a schematic circuit of a typical $E^2$ cell 100 used as a non-volatile configuration fuse.
Figure 2:
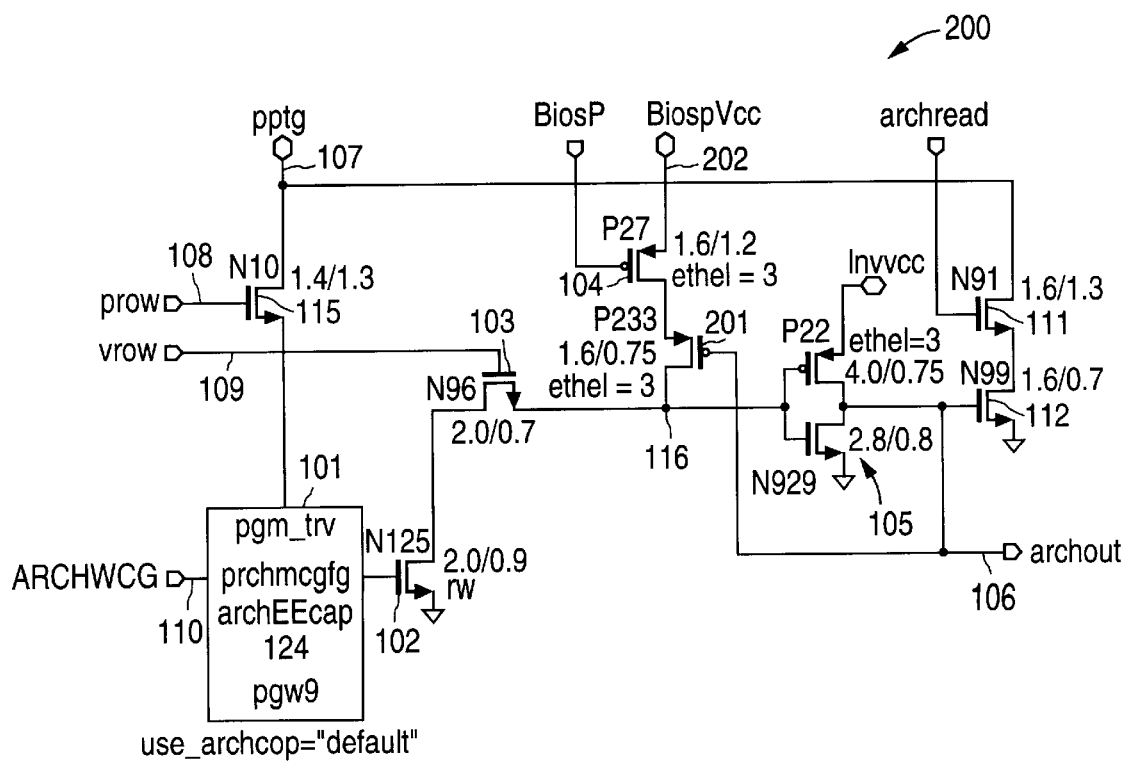
FIG. 2 is a schematic circuit of $E^2$ cell 200, in accordance with one embodiment of the present invention.

FIG. 2 is a schematic circuit of $E^2$ cell 200, in accordance with one embodiment of the present invention. $E^2$ cell 200 differs from $E^2$ cell 100 of FIG. 1 by including an PMOS transistor 201 between terminal 116 and the drain terminal of PMOS transistor 104, and by providing terminal 202, which provides a delayed supply voltage for inverter 105 during power-up. The gate terminal of NMOS transistor 201 is coupled to terminal 106, which is the output terminal of $E^2$ cell 200. The programming, erasing and verifying operations of $E^2$ cell 200 are substantially the same as those of $E^2$ cell 100 described above, and thus are not repeated here.

To read the content of storage transistor device 101 of $E^2$ cell 200, storage transistor device 101 is selected by providing a logic high voltage at terminal 109, which is coupled to the gate terminal of NMOS transistor 103. Drain terminal 116 of transistor 103 is coupled to the source terminal of NMOS transistor 201. If storage transistor device 101 is programmed, NMOS transistor 102 is conducting (i.e., the voltage at the gate terminal of NMOS transistor 102 is positive), thus pulling the voltage at terminal 116 to ground. Since the voltage at terminal 106 is initialized to be a logic low voltage in this instance (discussed below), PMOS transistor 201 is conducting. Conducting transistors 102 and 103 pull terminal 116 to a logic low voltage. When the delayed supply voltage on terminal 202 is driven to a logic high voltage, inverter 105 switches terminal 106 to a logic high voltage and turns off the conducting path through PMOS transistor 201. Hence, there is no current path thorough PMOS transistor 104 and NMOS transistor 102 and 103. Inverter 105 provides a logic high voltage at output terminal 106, indicating that storage transistor device 101 is programmed.

Conversely, if storage transistor device 101 is erased, transistor 102 is not conducting. Since the voltage at terminal 106 is initialized to be a logic low voltage in this instance (discussed below), PMOS transistor 201 is conducting. Transistor 104, which receives the bias voltage "Biasp" at gate terminal 113, pulls terminal 116 to a logic high voltage Consequently, when the delayed supply voltage at terminal 202 is driven to a logic high voltage, inverter 105 maintains a logic low voltage at terminal 106 to indicate that storage transistor device 101 is erased Since there is no current path from $V_{CC}$ to ground, $E^2$ cell 200 draws very little current during a read operation, regardless of its programmed state.

Figure 3:
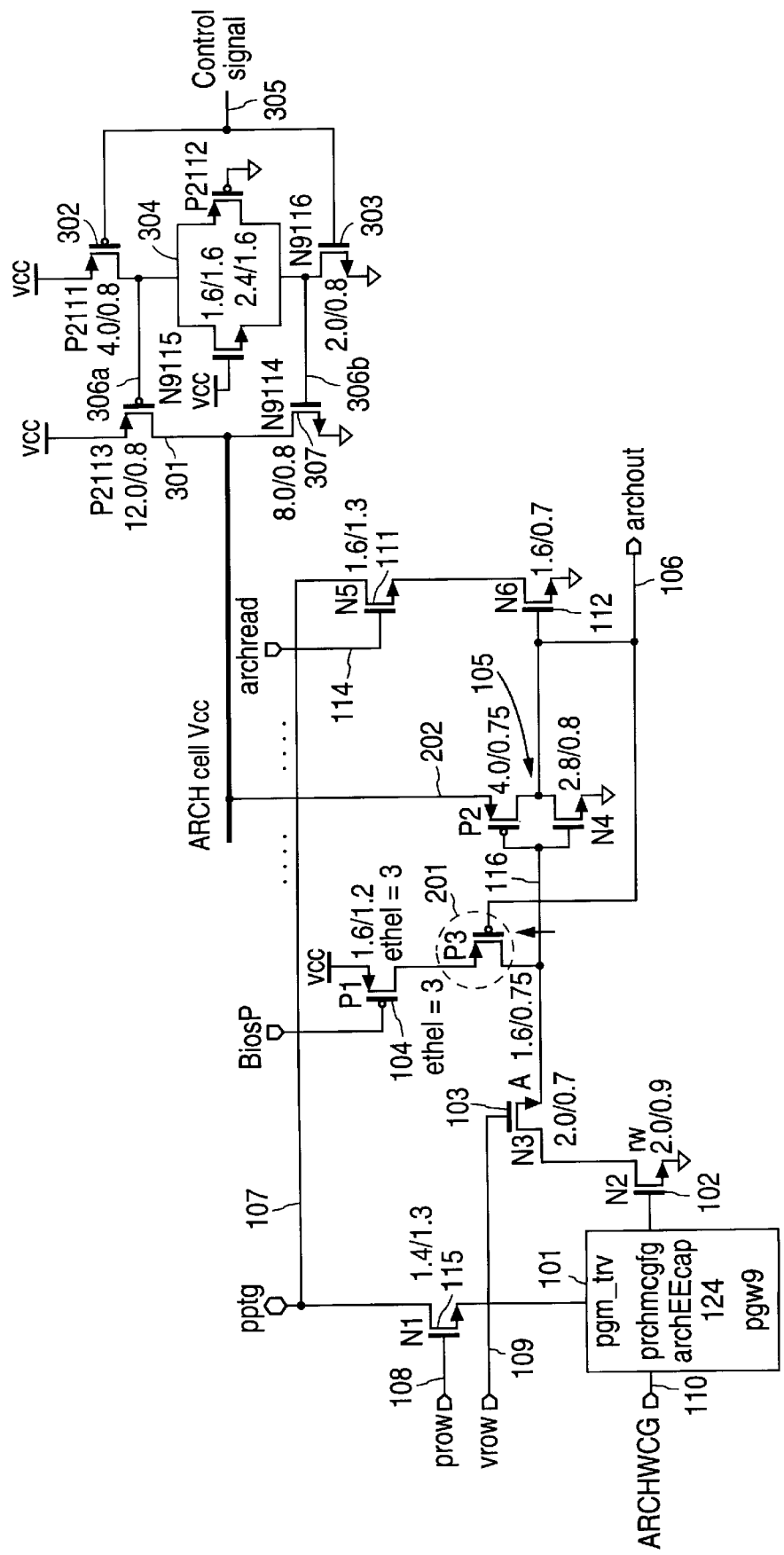
FIG. 3 illustrates the power-up sequence for initializing $E^2$ cell 200.

To prevent terminal 106 of $E^2$ cell 200 to be initialized to a logic high voltage, for an erased cell, a power-up sequence is provided, which is illustrated in FIG. 3. FIG. 3 shows terminal 202 coupled to a power bus "Arch_cell_Vcc", which is brought to the supply voltage $V_{CC}$ upon receiving a control signal at terminal 305. Transistors 301, 302, 303, 304 and 307 form a conventional non-inverting buffer. When the control signal at terminal 305 is not asserted (i.e., at a logic low voltage), terminals 306a and terminal 306b are at supply voltage $V_{CC}$, since PMOS transistor 302 is conducting and NMOS transistor 303 is not conducting. Consequently, NMOS transistor 307 pulls terminal 202 to ground. When the control signal at terminal 305 is asserted, transistor 303 brings terminals 306a and 306b to ground. As a result, PMOS transistor 301 pulls terminal 202 to supply voltage $V_{CC}$.

Upon power-up, the control signal at terminal 305 is not initially asserted. The gate terminal of PMOS transistor 104 receives a predetermined bias voltage. Terminals 202 and 109 are maintained at ground. As a result, terminal 106 is maintained at ground, thereby ensuring that PMOS transistors 104 and 201 pull terminal 116 a logic high voltage close to supply voltage $V_{CC}$. Then, a bias logic high voltage is applied to terminal 109. If storage transistor 101 is erased, the voltage at terminal 116 remains at the logic high voltage. Conversely, if storage transistor 101 is programmed, NMOS transistor 102 pulls terminal 116 to ground. Thereafter, the control signal at terminal 305 is asserted to bring terminal 202 to supply voltage $V_{CC}$. As a result, terminal 106 is brought to a logic high voltage, if terminal 116 is at ground (i.e., storage transistor device 101 is programmed), and brought to a logic low voltage, if terminal 116 is at logic high (i.e., storage transistor device 101 is erased).

Figure 4:
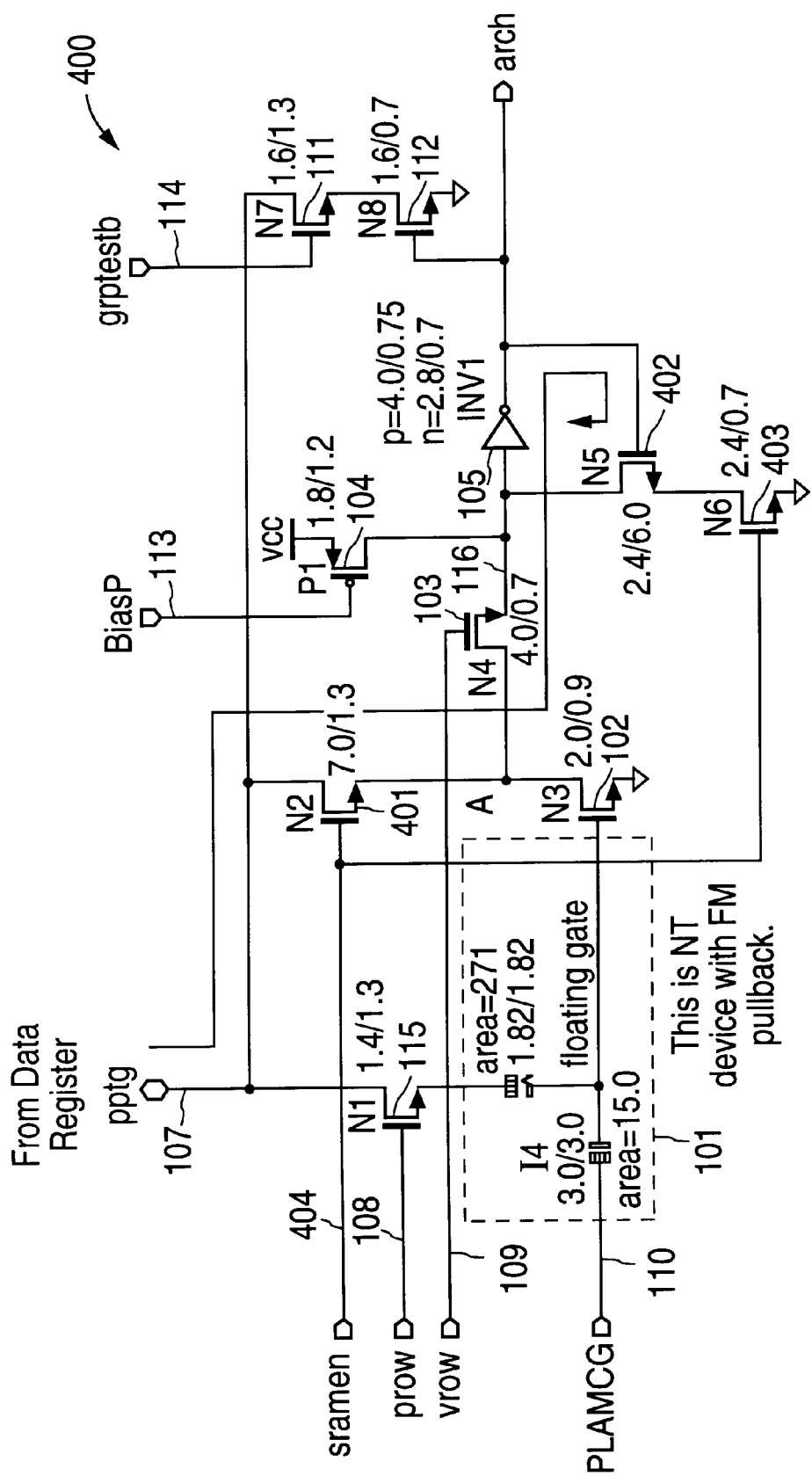
FIG. 4 is a schematic circuit of $E^2$ cell 400, which can be written and read as a static random access memory (SRAM) cell during testing.

According to the present invention, an $E^2$ cell can be modified to isolate storage transistor device 101 from the rest of the $E^2$ cell of a programmable integrated circuit for testing, with the $E^2$ cell behaving as though it is a static random access memory (SRAM) cell. One example of this modification is illustrated by $E^2$ cell 400 of FIG. 4. As shown in FIG. 4, $E^2$ cell 400 differs from $E^2$ cell 100 of FIG. 1 by including NMOS transistors 401, 402 and 403, and receiving an enable signal SRAMEN at terminal 404. With storage logic device 101 erased, when asserted (i.e., at a logic high voltage), enable signal SRAMEN at terminal 404 allows $E^2$ cell 400 to operate as a SRAM cell. When enable signal SRAMEN is not asserted (i.e., at a logic low voltage), NMOS transistors 401 and 403 are non-conducting, so that $E^2$ cell 400 is functionally equivalent to $E^2$ cell 100 discussed above. Thus, during functional operation, when enable signal SRAMEN is not asserted, $E^2$ cell 400 operates substantially identically to $E^2$ cell 100.

To write into $E^2$ cell 400 as a SRAM cell, storage transistor device 101 is first erased, such that NMOS transistor 102 becomes non-conducting. A logic level voltage is provided at terminal 107. When enable signal SRAMEN is asserted and $E^2$ cell 400 is selected by providing a logic high voltage at terminal 109, if a logic high voltage is provided at terminal 107, conducting transistors 103 and 401 pull terminal 116 towards Vcc. Consequently, the output voltage of inverter 105 at terminal 106 is a stable logic low voltage. In this instance, NMOS transistor 402 is non-conducting. Conversely, if a logic low voltage is provided at terminal 107, a conductive path is created by NMOS transistors 103 and 401, so that terminal 116 is pulled towards ground. Consequently, inverter 105 provides a logic high output value at terminal 106. The logic high output value at terminal 106 turns on NMOS transistor 402, allowing terminal 106 to be rapidly pulled to ground. As a result, the output value of $E^2$ cell 400 transitions to a stable logic high value. Thus, regardless of the logic value provided at terminal 107, the output terminal of $E^2$ cell 400 at terminal 106 can be considered the inverted output terminal of an SRAM cell. Terminal 116 can be tapped to provide a non-inverted SRAM output value. Since the value at terminal 107 is written into $E^2$ cell 400 without high voltage programming of storage transistor device 101, the time required for writing into $E^2$ cell 400 as a SRAM cell can be shorter than 100 nanoseconds.

$E^2$ cell 200 of FIG. 2 can be modified in the same manner as illustrated by $E^2$ cell 400 above to allow $E^2$ cell 200 to be read and written as a SRAM cell during testing.

Figure 5:
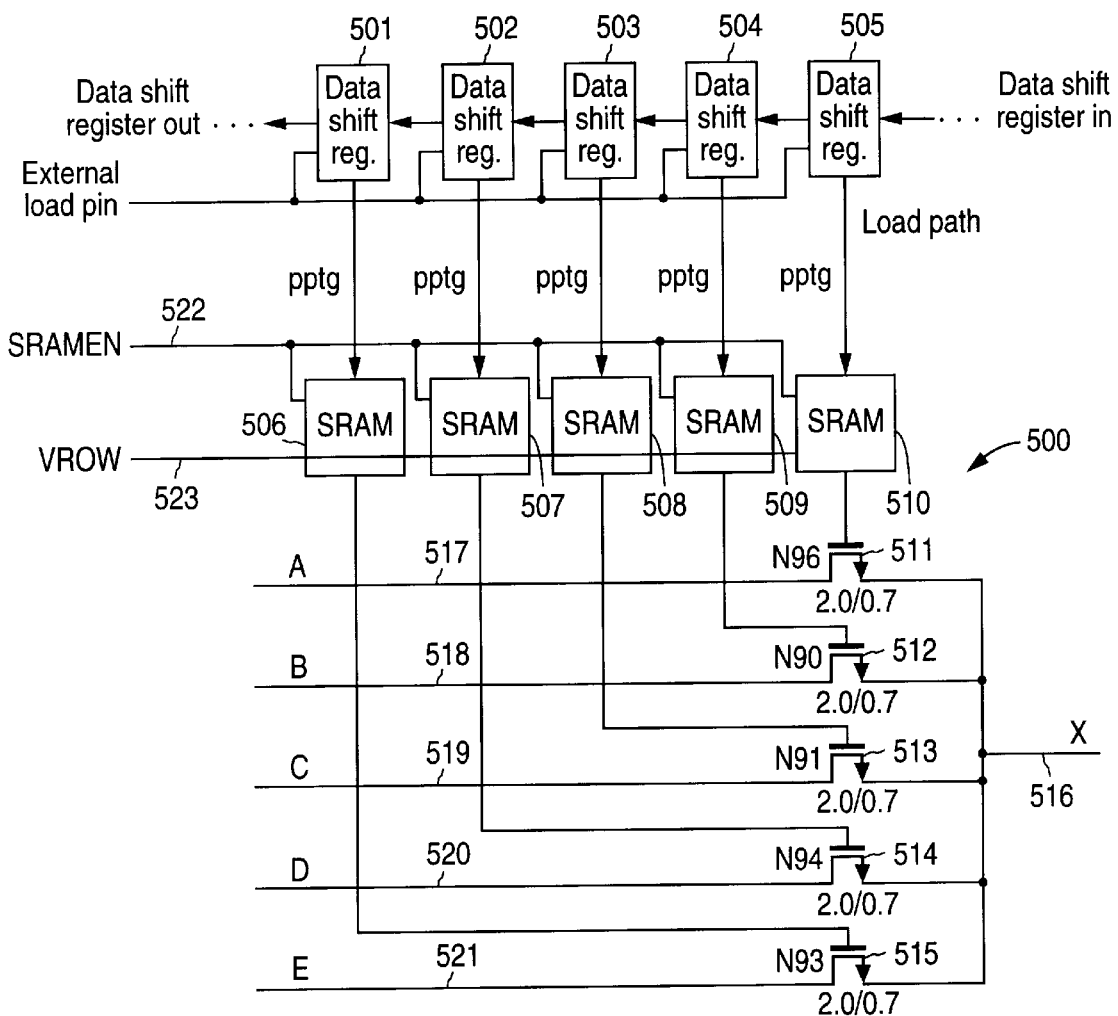
FIG. 5 illustrates the use of modified $E^2$ cells of the present invention (e.g., $E^2$ cell 400) to allow fast testing of a functional circuit configured by these $E^2$ cells.

FIG. 5 illustrates the use of modified $E^2$ cells of the present invention (e.g., $E^2$ cell 400) to allow fast testing of functional circuit 500 configured by these $E^2$ cells. As shown in FIG. 5, functional circuit 500 includes a 5 to 1 multiplexer formed by NMOS transistors 511–515, in which each NMOS transistor is controlled by the inverted SRAM output value of $E^2$ cells 506–510. To test functional circuit 500, a shift register formed by serially connected 1-bit memory cells 501–505 is provided. Initially, memory cells 501–505 contains the bit pattern "11110." This bit pattern is then strobed into $E^2$ cells 505–510 by asserting control signal VROW at terminal 523 and enable signal SRAMEN at terminal 522. As a results only NMOS transistor 511 of NMOS transistors 511–515 is selected (i.e., made conducting), thus selecting the logic value at terminal 517 to be output at terminal 516. Functional circuit 500 can be tested using a high clock rate (e.g., 10 MHz for 100 nanosecond periods). At each successive time period, a "0" value can be shifted into shift register of memory cells 501–505, so that NMOS transistors 512–515 are successively selected to output the corresponding logic values of terminals 517–522 onto terminal 516.

The above detailed description is provided to illustrate the specific embodiments of the present invention and is not intended to be limiting. Numerous modifications and variations within the scope of the present invention are possible. The present invention is set forth in the following claims.

I claim:

1. An electrically erasable non-volatile memory cell, comprising:

a bit line;

a word line;

a storage cell including a floating gate transistor for storing a logic value;

an input transistor, controlled by a first control signal on said word line, for writing into said storage cell, as said logic value, a logic voltage on said bit line;

a pass transistor, controlled by a second control signal and coupled to said storage cell, for providing said logic value on a first terminal;

an inverting output buffer coupled to said first terminal for providing as an output logic value the logical complement of said logic value; and a pull-up circuit coupled to said first terminal to urge a voltage on said first terminal towards a supply voltage, said pull-up circuit being controlled by said output logic value.

2. An electrically erasable non-volatile memory cell as in claim 1, wherein said pull-up circuit comprises:

a first transistor having a drain terminal, a gate terminal and a source terminal, said source terminal of said first transistor being coupled to a supply voltage, said gate terminal of said first transistor receiving a bias voltage; and a second transistor having a drain terminal, a gate terminal and a source terminal, said source terminal of said second transistor being coupled to said drain terminal of said first transistor, said gate terminal of said second transistor being coupled to receive said output logic value, and said drain terminal of said second transistor being coupled to said first terminal.

3. An electrically erasable non-volatile memory cell as in claim 1, further comprising a control circuit providing power to said inverting output buffer, said control circuit configured such that said inverting output buffer receives power subsequent to said pull-up circuit urging said voltage on said first terminal.

* * * * *